US012610657B2

(12) United States Patent
Ollier et al.

(10) Patent No.: US 12,610,657 B2
(45) Date of Patent: Apr. 21, 2026

(54) METHOD FOR SELECTIVELY FILLING, WITH A FILLING LIQUID, A GROUP OF CAVITIES FROM AMONG A PLURALITY OF CAVITIES

(71) Applicants: COMMISSARIAT A L'ENERGIE ATOMIQUE ET AUX ENERGIES ALTERNATIVES, Paris (FR); ALEDIA, Grenoble (FR)

(72) Inventors: Emmanuel Ollier, Grenoble Cedex (FR); Fabrice Emieux, Grenoble Cedex (FR); Frédéric Roux, Grenoble Cedex (FR); Ulrich Soupremanien, Grenoble Cedex (FR); Sylvia Scaringella, Montbonnot-Saint-Martin (FR); Tiphaine Dupont, Grenoble (FR); Clémence Tallet, Saint-Egreve (FR); Abdelhay Aboulaich, Grenoble (FR)

(73) Assignees: COMMISSARIAT A L'ENERGIE ATOMIQUE ET AUX ENERGIES ALTERNATIVES, Paris (FR); ALEDIA, Grenoble (FR)

( * ) Notice: Subject to any disclaimer, the term of this patent is extended or adjusted under 35 U.S.C. 154(b) by 578 days.

(21) Appl. No.: 17/415,444

(22) PCT Filed: Nov. 29, 2019

(86) PCT No.: PCT/FR2019/052849
§ 371 (c)(1),
(2) Date: Jun. 17, 2021

(87) PCT Pub. No.: WO2020/128182
PCT Pub. Date: Jun. 25, 2020

(65) Prior Publication Data
US 2022/0029048 A1 Jan. 27, 2022

(30) Foreign Application Priority Data

Dec. 20, 2018 (FR) ...................................... 1873500

(51) Int. Cl.
*H10H 20/811* (2025.01)
*H10H 20/812* (2025.01)
(Continued)

(52) U.S. Cl.
CPC ........ *H10H 20/811* (2025.01); *H10H 20/812* (2025.01); *H10H 20/813* (2025.01);
(Continued)

(58) Field of Classification Search
CPC .... H10K 50/115; H10K 59/12; H10K 59/122; H10K 71/00; H10K 59/173; H10K 59/35;
(Continued)

(56) References Cited

U.S. PATENT DOCUMENTS 9,936,608 B2 4/2018 Soupremanien et al.
9,967,937 B2 5/2018 Robin et al.
(Continued)

FOREIGN PATENT DOCUMENTS

FR 3 012 676 A1 5/2015
FR 3 046 021 A1 6/2017
FR 3 053 530 A1 1/2018

OTHER PUBLICATIONS

International Search Report issued on Apr. 9, 2020 in PCT/FR2019/052849 filed on Nov. 29, 2019, 2 pages.
(Continued)

*Primary Examiner* — Mark W Tornow
*Assistant Examiner* — Priya M Rampersaud
(74) *Attorney, Agent, or Firm* — Oblon, McClelland, Maier & Neustadt, L.L.P.

(57) ABSTRACT
A method for selectively filling, with a filling liquid, a first cavity from among a plurality of cavities, each cavity
(Continued)

opening out at a front face of a substrate. The method includes a processing step for altering the surface energy of the first internal surface of the first cavity or the surface energy of the second internal surfaces of the other cavities, such that the first surface has a first surface energy and the second surfaces have a second surface energy, and a step including a sequence for spreading the filling liquid, the first energy and the second energy being adjusted such that the first and the second surfaces exert an attracting effect and a repelling effect, respectively, on the liquid.

33 Claims, 9 Drawing Sheets

(51) Int. Cl.
   *H10H 20/813*        (2025.01)
   *H10H 20/819*        (2025.01)
   *H10H 20/824*        (2025.01)
   *H10H 20/833*        (2025.01)
   *H10H 20/84*         (2025.01)
   *H10H 20/851*        (2025.01)
(52) U.S. Cl.
   CPC ........ *H10H 20/819* (2025.01); *H10H 20/824* (2025.01); *H10H 20/833* (2025.01); *H10H 20/84* (2025.01); *H10H 20/851* (2025.01)
(58) Field of Classification Search
   CPC ............ H10K 59/353; H10K 2102/00; H10K 59/352; B05D 5/06; H05B 33/145; H05B 33/14; H05B 45/00; H05B 45/20; H05B 45/24; C01B 32/16; C01B 32/168; C09K 11/08; G02F 1/133519; G02F 1/133617; G02F 2202/36; G02F 1/133516; G02F 1/133514; G02B 5/223; H01L 33/50; H01L 33/08; H01L 2933/0041; H01L 33/18; H01L 33/501; H01L 33/44; H01L 33/06; H01L 33/504; H01L 33/507; H01L 25/0753; H01L 27/153; H01L 33/502; H01L 27/156; H01L 2933/005; H01L 33/56; H01L 33/16; H01L 33/24; H01L 33/32; H01L 33/0025; H01L 33/0041; H01L 33/20; H01L 33/42; H01L 33/505; H01L 25/167; H01L 2933/44; H01L 33/504153; H01L 27/156; B82Y 20/00; H01S 5/0035; H01S 5/021; H01S 5/0213; H01S 5/04257; H01S 5/3201; H01S 5/32025; H01S 5/320275; H01S 5/343; H01S 5/34333; H10H 20/851; H10H 20/0361; H10H 20/813; H10H 20/818; H10H 20/8513; H10H 29/142; H10H 20/062; H10H 20/812; H10H 20/824; H10H 20/825; H10H 20/0137; H10H 20/052; H10H 20/817; H10H 20/821; H10H 20/811; B01L 2300/165; G09G 2300/0452; G09G 2300/0809; G09G 2340/06; G09G 3/2003; G09G 3/3208; G09G 3/3233; B32B 2307/728; B32B 2255/00

See application file for complete search history.

(56)                    References Cited

U.S. PATENT DOCUMENTS

| | | | |
|---|---|---|---|
| 10,185,066 B2 * | 1/2019 | Chae ...................... | H10K 59/38 |
| 10,923,528 B2 | 2/2021 | Dupont et al. | |
| 2004/0218127 A1 * | 11/2004 | Miura ............... | G02F 1/133305 |
| | | | 349/122 |
| 2010/0327258 A1 * | 12/2010 | Lee ................... | H01L 21/02521 |
| | | | 257/14 |
| 2011/0014389 A1 * | 1/2011 | Ito .......................... | H10K 71/16 |
| | | | 427/535 |
| 2012/0019486 A1 | 1/2012 | Kim et al. | |
| 2013/0087822 A1 * | 4/2013 | Kim ...................... | H10H 20/853 |
| | | | 257/E33.059 |
| 2014/0091343 A1 | 4/2014 | Nakano et al. | |
| 2014/0131748 A1 * | 5/2014 | Song ................... | H01L 25/0753 |
| | | | 257/89 |
| 2017/0104042 A1 * | 4/2017 | Wang ................... | H10K 59/173 |
| 2017/0186828 A1 * | 6/2017 | Hsin .................... | H10K 59/122 |
| 2018/0011231 A1 * | 1/2018 | Jiang ...................... | G02B 5/201 |
| 2018/0046013 A1 * | 2/2018 | Jiang ................. | G02F 1/133602 |
| 2018/0138411 A1 * | 5/2018 | Hung .................... | H10K 71/191 |
| 2018/0341055 A1 * | 11/2018 | Yuan ..................... | G02B 6/0053 |
| 2019/0025442 A1 * | 1/2019 | Sawamoto ........... | G01T 1/2012 |
| 2019/0267437 A1 * | 8/2019 | Hou ..................... | H10K 59/122 |
| 2021/0288295 A1 * | 9/2021 | Song ................... | H10K 59/173 |

OTHER PUBLICATIONS

French Preliminary Search Report (with English translation of Categories of Cited Documents) issued on Aug. 6, 2019 in French Application 1873500 filed on Dec. 20, 2018, 2 pages.
Zhu, X. et al., "Experiments and analysis on self-motion behaviors of liquid droplets on gradient surfaces," Experimental Thermal and Fluid Science, vol. 33, 2009, pp. 947-954.

* cited by examiner

METHOD FOR SELECTIVELY FILLING, WITH A FILLING LIQUID, A GROUP OF CAVITIES FROM AMONG A PLURALITY OF CAVITIES

TECHNICAL FIELD

The present invention relates to a method for selectively filling cavities. In particular, the present invention relates to a method for selectively filling, with a filling material, cavities which accommodate light-emitting diodes at the bottom.

The filling method according to the present invention is advantageously used for the manufacture of colour pixels of displays or projection devices.

The filling method is advantageously used for the manufacture of electronic, optoelectronic, electromechanical (MEMS) or optoelectromechanical (MOEMS) devices.

PRIOR ART

Methods for manufacturing microelectronic, optoelectronic, electromechanical or even optoelectromechanical devices may involve filling cavities with a filling liquid.

Such a filling may be, according to a first technique known to the person skilled in the art, a collective filling of a plurality of cavities.

In particular, the collective filling may comprise spreading the filling liquid on a face, referred to as the front face, at which the cavities open out, in particular by means of a spinner.

However, this technique is not satisfactory.

Indeed, this technique does not make it possible to distinguish the cavities from one another, and for example to fill the cavities with different filling liquids in a selective manner.

In order to address this problem, a method for individually filling cavities has been proposed, for example with printing means, or drip-feed distribution means.

However, this technique is not satisfactory either.

Indeed, the latter severely limits production rates.

Furthermore, this technique loses its efficacy with regard to filling cavities of very small dimensions in an individual manner.

Lastly, the cost of this technique is not always compatible with the current requirements of the industry.

However, the selective filling of cavities is of particular interest, especially for the manufacture of display devices (or screens) or projection devices.

For example, a display device may comprise light-emitting diodes (LEDs), and in particular LEDs set up to produce a plurality of colours.

The LEDs may in particular be nanowire LEDs such as those described in document [1] cited at the end of the description, and shown in FIG. 1.

In this display device, the LEDs are formed at the bottom of cavities C which open out at a face, referred to as the front face, of a support substrate. The bottom of each cavity is topped with a wall P, referred to as the lateral wall, and together with the latter delimits a cavity volume V.

The cavity volume is then filled with a material, referred to as the encapsulation material M, charged with phosphors configured to convert the electromagnetic radiation likely to be emitted by an LED into electromagnetic radiation with a different wavelength.

In case of a colour display device, the cavities with their LEDs are arranged in groups of cavities to form pixels.

The capacity of a given pixel to display different colours is then obtained by filling each of the cavities of said pixel with an encapsulation material charged with phosphors having different light conversion properties from one cavity to another.

It is thus proposed in this document [1] to selectively fill the cavities of a given pixel with an encapsulation material, for example a silicone matrix charged with phosphors, by inkjet.

As mentioned above, the filling technique described in document [1] is not satisfactory.

Document [2] cited at the end of the description proposes an alternative method of selectively filling cavities.

In particular, document [2], with reference to its FIG. 1a, proposes adapting the geometry of the cavities, and in particular uses cavities of different sizes.

More precisely, document [2] considers a first type of cavity, small in size and cylindrical in shape, and a second type of cavity forming a network of interconnected channels of larger size.

Thus, a liquid phase material, such as a molten phase change material (PCM), spread onto the surface where the cavities open out, will preferentially fill the smaller cavities and in particular the first cavities.

However, this selective filling technique is not satisfactory.

Indeed, it imposes particular cavity geometries, and cannot be used when all the cavities have identical geometric characteristics.

One aim of the present invention is therefore to propose a method for selectively filling cavities, with a filling liquid, which does not affect the production rates.

Another aim of the present invention is also to propose a method for selectively filling cavities, with a filling liquid, which is independent of the size and/or the geometric shape of the cavities.

Another aim of the present invention is also to propose a method for selectively filling, with a filling liquid, small cavities, and in particular cavities having an opening with the largest dimension being less than 20 micrometres.

Another aim of the present invention is also to propose a method for selectively filling cavities with a filling liquid, which is simpler to implement than the known methods of the prior art.

DESCRIPTION OF THE INVENTION

The aims of the present invention are, at least in part, achieved by a method for selectively filling, with a filling liquid, a cavity, referred to as the first cavity, of a least one group of cavities each opening at a face, referred to as the front face, of a substrate, each of the cavities comprising an inner surface, the method comprising the following steps:

a) a treatment step for modifying the surface energy of the inner surface of the first cavity, referred to as the first surface, or the surface energy of the inner surfaces, referred to as second surfaces, of cavities other than the first cavity, referred to as second cavities, such that the first surface has a first surface energy and the second surfaces have a second surface energy different from the first energy;

b) a step which comprises at least one sequence of spreading filling liquid on the front face;

the first and the second energy being adjusted such that the first and the second surfaces exert on the filling liquid, respectively, an attracting force and a repelling force, step b) thus resulting in the selective filling, with the filling liquid, of the first cavity with respective to the second cavities.

The surface energy of a given surface, according to the present invention, conditions the capacity of a liquid to wet said surface. The capacity of a liquid to wet the surface can in particular be obtained by measuring a contact angle when a drop of said liquid rests on the surface in question (a method of measuring a contact angle is described in document [4] cited at the end of the description).

In particular, the greater the contact angle, the more the surface on which the liquid rests exerts a repelling effect on said liquid. Conversely, the smaller the contact angle, the more the surface on which the liquid rests exerts an attracting effect on said liquid.

If the filling liquid is an aqueous phase, a surface exerting an attracting effect on said liquid is said to be a hydrophilic surface, whereas in the opposite case it is said to be a hydrophobic surface.

Thus, the filling method according to the present invention makes it possible in a selective manner to fill a first cavity among a group of cavities without consideration of the shape and/or size.

In other words, the cavities may be identical.

Furthermore, the method according to the present invention may advantageously be used to selectively and collectively fill each of the first cavities of a plurality of groups of cavities arranged on the same substrate.

The production rates are then not affected, and therefore remain compatible with the requirements of the industry.

Furthermore, the method according to the present invention is not sensitive to the size of the particles so that it is possible to fill cavities of very small size, and in particular cavities smaller than several tens of micrometres, advantageously smaller than 10 micrometers, even more advantageously smaller than 5 micrometers, for example equal to 1 micrometer.

The "size of a cavity" is defined as the largest dimension of its opening.

According to one implementation mode, step a) of the treatment comprises a plasma treatment or a treatment with ultraviolet radiation carried out selectively on the first surface or on the second surfaces.

According to one implementation mode, step a) is carried out selectively on the first surface or on the second surfaces by means of masking, respectively, the second surfaces or the first surface.

According to one implementation mode, step a) is preceded by step a1) of forming a layer, referred to as the passivation layer, by covering the first surface and the second surfaces, the passivation layer being made of a material, referred to as the active material, configured to modify its surface energy with the effect of the treatment of step a).

According to one implementation mode, the passivation layer comprises at least one of the materials selected from among: a siloxane compound, a fluorosilane, a fluoropolymer, octadecyltriethoxysilane, propyltrimethoxysilane, propyltriethoxysilane, octadecyltrimethoxysilane, octyltrimethoxysilane, octyltriethoxysilane, dodecyl triethoxysilane, dimethoxy-methyl(3,3,3-trifluoropropyl)silane, trichloro(octadecyl)silane, trichloro(3,3,3-trifluoropropyl)silane, 1H,1H,2H,2H-perfluorodecyltrimethoxysilane.

According to one implementation mode, the passivation layer is formed according to a chemical vapour deposition method, in particular plasma-activated.

According to one implementation mode, the step of spreading the filling liquid uses a scraper or a slot die.

According to one implementation mode, the filling liquid is a mixture comprising a solvent, a filling matrix and a charge, referred to as an active charge.

According to one implementation mode, step b) comprises a plurality, advantageously two, spreading sequences of the filling liquid, and the execution of an evaporation sequence of the solvent following each spreading sequence.

According to one implementation mode, the evaporation sequence of the filling liquid comprises a heat treatment step for evaporating the solvent.

According to one implementation mode, the filling matrix is also adapted to solidify during the heat treatment step, and thereby trap the active charge in its volume.

According to one implementation mode, the solvent comprises a solution of propylene glycol monomethyl ether acetate.

According to one implementation mode, the filling matrix comprises an acrylate type transparent material, advantageously poly(methyl methacrylate) (PMMA), or a silicone or a polymer.

According to one implementation mode, the active charge comprises a conversion material, in particular an optical conversion material.

According to one implementation mode, the optical conversion material comprises quantum dots (QD), nanoplatelets or phosphors.

According to one implementation mode, the bottom of each of the cavities is functionalised.

According to one implementation mode, the functionalisation of the bottom of each of the cavities comprises the use of a light-emitting diode, advantageously the light-emitting diode being in the form of at least one nanowire.

The invention also relates to a manufacturing method for filling each of the cavities of a group of cavities with a different filling liquid, the manufacturing method comprising successively filling each of the cavities according to the filling method of the present invention.

According to one implementation mode, the group of cavities forms a pixel of a display device, in particular, each of the cavities of the pixel is intended to emit a different colour.

BRIEF DESCRIPTION OF THE DRAWINGS

Other features and advantages will become apparent in the following description of the method for selectively filling cavities according to the invention, given by way of non-limiting examples, with reference to the accompanying drawings in which:

FIG. 2a shows a cavity formation step, FIG. 2b shows step a1), FIG. 2c shows step a) of treatment, and FIG. 2d shows step b).

FIGS. 4a and 4b show, in particular, second cavities and first cavities, respectively;

FIGS. 5a and 5b show, in particular, the second cavities and first cavities, respectively;

FIGS. 6a and 6b show, in particular, the second cavities and the first cavities, respectively;

FIGS. 7a and 7b show, in particular, second cavities and first cavities, respectively;

DETAILED DESCRIPTION OF PARTICULAR EMBODIMENTS

Figure 1:
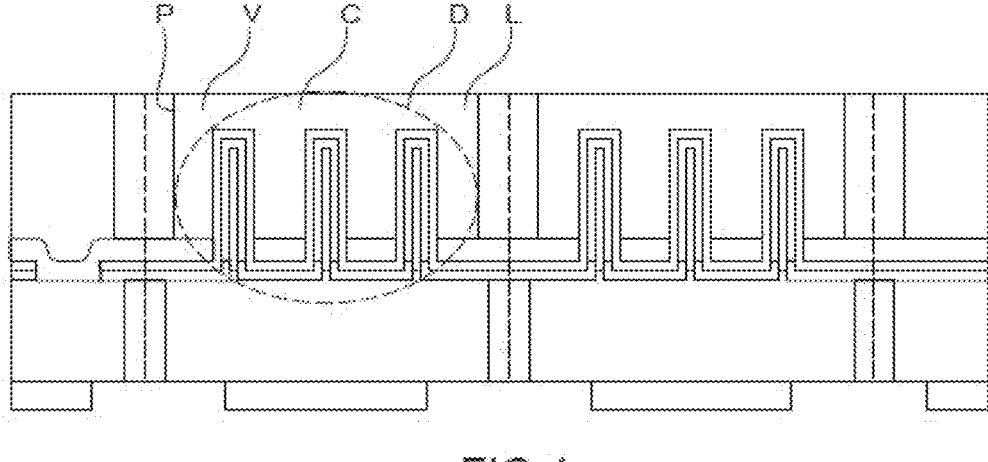
FIG. 1 is a schematic representation of a display device provided with LEDs in the form of nanowires formed at the bottom of cavities, and filled with a filling liquid.
Figure 2A:
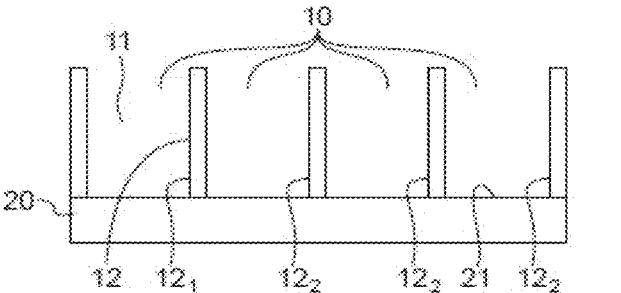
FIGS. 2a, 2b, 2c, 2d are schematic representations of different steps that may be implemented as part of the present invention, in particular
Figure 2B:
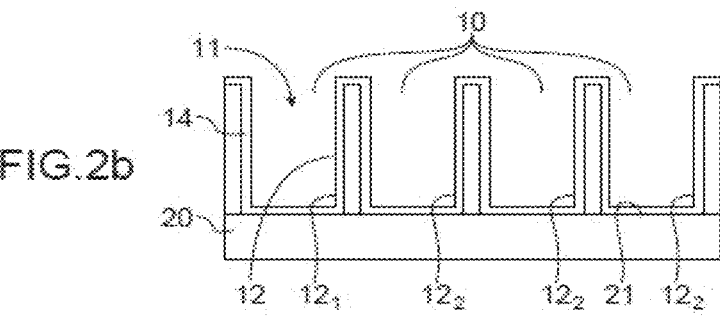
Figure 2C:
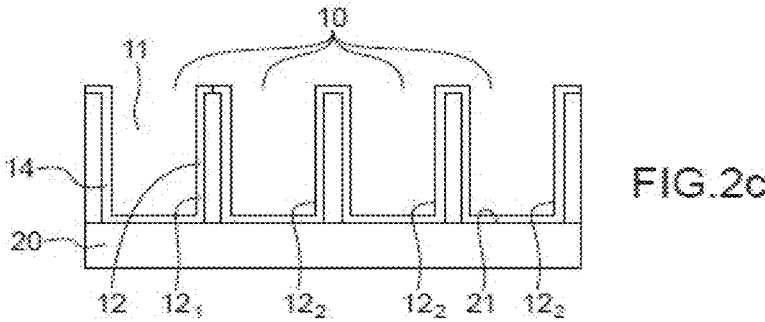
Figure 2D:
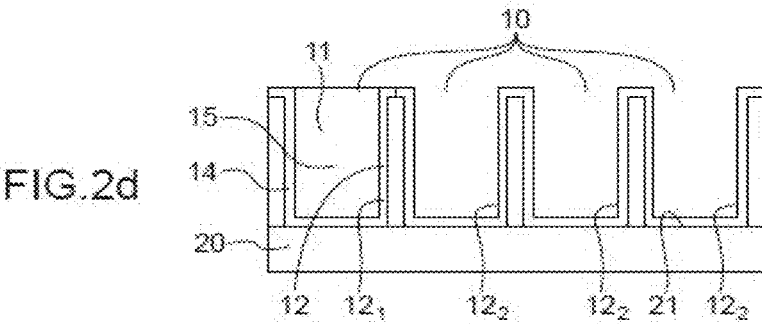

The method according to the present invention relates to a method for selectively filling, with a filling liquid, a first cavity selected from among at least one group of cavities.

More particularly, the method according to the present invention uses a mechanism for differentiating the surface energy of the cavities which makes it possible to facilitate the filling, with the filling liquid, of the first cavity with respect to the other cavities.

In particular, the surface energy of the surface of the first cavity is adapted such that the surface of the first cavity and the surfaces of the other cavities exert on the filling liquid, respectively, an attracting and a repelling effect, thus resulting in the selective filling, with the filling liquid, of the first cavity with respect to the other cavities.

The method according to the present invention may be used in particular for filling successively all of the cavities of the group of cavities.

FIGS. 2a to 2d illustrate a method for filling, with a filling liquid 15, a cavity, referred to as the first cavity 11, among a group of cavities 10.

Each of the cavities of the group of cavities 10 opens out at a face, referred to as a front face 21, of a support substrate 20.

The cavities comprise, in this respect, an inner surface 12.

The inner surface 12 may comprise a bottom topped with wall. The wall may be concave, convex or flat.

The cavities may also have other forms, and for example be conical, pyramidal or U-shaped.

The formation of the cavities may involve a step of etching the support substrate 20 from its front face 21, and in particular etching a silicon substrate.

However, other techniques involving the growth of materials may be considered, for example and in a non-limiting manner, the formation of cavities may be carried out electrochemically. It is also possible to transfer a metal grid or to etch a grid into a (metal) material deposited on a silicon support.

The walls of the cavities may be orthogonal to the front face 21 of the support substrate 20.

A coating may cover the inner surface 12, for example the coating may comprise at least one of the materials selected from among: a metal, an oxide, a nitride.

The inner surface 12 of each of the cavities may be functionalised. For example, the inner surface may comprise one or more electronic, microelectronic devices.

For example, if the cavities comprise a bottom, one or more electroluminescent structures may be disposed on the latter.

An "electroluminescent structure" is defined generally as a structure that emits light radiation when current is passed through it.

The electroluminescent structures may comprise 2D light-emitting diodes, i.e. planar, and thus comprise a stack of semiconductor films.

Alternatively, the light-emitting structures may be 3D light-emitting diodes, each comprising a plurality of light-emitting nanowires or microwires or pyramids perpendicular to the bottom of the cavity on which they rest.

Each light-emitting diode may comprise a stack of a first layer of semi-conductor material X, and a second layer of semi-conductor material W with opposite conductivities with an active layer Y interposed between them. In particular, the dopings of the first layer of semi-conductor material X and the second layer of semiconductor material W are of N-type and P-type respectively.

The active layer Y may comprise means of containment.

For example, the active layer Y may comprise a single quantum well made of a semi-conductor material whose energy gap is smaller than the energy gap of both semiconductor materials forming respectively, the first layer X and the second layer W.

Also by way of example, the active layer Y may comprise a stack of a plurality of quantum wells, and in particular an alternation of quantum wells and barrier layers.

Thus, and in a non-limitative manner, the first layer X and the second layer W may comprise GaN, whereas the active layer Y may comprise InGaN.

The use of nanowires or microwires may, in this respect, involve stacks formed by an area of GaN-n, an active area, an area of GaN-p or InGaN-p.

In this respect, a person skilled in the art can consult the patent application [3] cited at the end of the description, and more particularly, from page 19, line 24 to page 20, line 10.

The filling method then comprises a step a) of modifying the surface energy of the inner surface $12$ of the first cavity $11$, referred to as the first surface $12_1$, or the surface energy of inner surfaces, referred to as the second surfaces $12_2$, cavities other than the first cavity $11$, referred to as second cavities.

In particular, following step a), the first surface $12_1$ has a first energy, whereas the second surfaces $12_2$ have a second energy different from the first energy.

In the following, and for the sake of simplification, it is considered that step a) is intended to modify the surface energy of the first surface $12_1$.

However, the person skilled in the art, with their general knowledge and on reading the present description will find the information necessary for implementing step a) for modifying the surface energy of the second surfaces.

It is understood within the meaning of the present invention that step a) selectively modifies the surface energy of the inner surface $12$ of the first cavity $11$, and leaves the surface energy of the inner surfaces of the second cavities unchanged.

Step a) may in particular involve exposure to an energy flow.

The exposure to the energy flow may comprise exposure to a plasma, and more particularly an ozone plasma.

In a complementary and/or alternative manner, the exposure to the energy flow may comprise exposure to ultraviolet radiation, the ultraviolet radiation may in particular comprise light emission with a wavelength equal to 248 nanometres or 193 nanometres.

In a complementary and/or alternative manner, the exposure to the energy flow may comprise exposure to ultraviolet (UV) laser radiation, in particular emitted by a pulsed excimer laser source. The wavelength of the UV radiation may be between 150 nm and 350 nm, for example 248 nm.

The laser pulses may have a frequency between 1 Hz and 1000 Hz, for example between 20 Hz and 300 Hz, and a half-value width between 1 ps and 100 ns, for example equal to 25 ns.

The fluence of laser pulses may comprise between 1 mJ/cm$^2$ and 1000 mJ/cm$^2$, for example between 230 mJ/cm$^2$ and 330 mJ/cm$^2$.

The exposure to ultraviolet laser radiation may also be performed by maintaining a strongly oxidising atmosphere in the vicinity of the surface to be treated.

The strongly oxidising atmosphere may in particular be rich in oxygen (for example the concentration of oxygen may be higher than 20%), or comprise ozone (the ozone concentration may in particular be between 0.1 ppm and 100 ppm, preferably between 1 ppm and 10 ppm).

The use of a strongly oxidising atmosphere improves the efficacy of step a).

Alternatively and/or additionally, step a) may comprise an ablation, in particular a rapid ablation, of a stack of layers formed on the inner surface of the cavities. In particular, the stack of layers may comprises a passivation layer $14$ (described in the following), in particular a hydrophobic passivation layer, resting on another layer, referred to as sub-layer $14_1$ made of a material adapted to give said sub-layer $14_1$ a hydrophilic nature (i.e. attractive to water). This material forming the sub-layer $14_1$ is also selected to have a coefficient of thermal expansion (CTE) very different from the passivation layer $14$.

The sub-layer $14_1$ may in particular comprise a silicon nitride, or an oxide of this family ($Si_xN_y$, $Si_xO_zN_y$).

By way of example, the contact angle of water measured on a SiN surface is 40°, whereas it is greater than 100° on a siloxane SiOC surface. The CTE of SiN is $3.3 \ 10^{-6} \ K^1$ whereas it is $3.1 \ 10^{-4} \ K^1$ for SiOC.

The formation of a silicon nitride layer is known to a person skilled in the art and may particular be implemented by PECVD. The thickness of the sub-layer $14_1$ may be between 10 nm and 5 µm, preferably 500 nm.

Step a) is then performed with the laser radiation source described above. In particular, the laser radiation is emitted in such a way as to selectively spray the passivation layer of the first surface $12_1$, and thus uncover the sub-layer $14_1$. It is therefore understood that the stack resting on the second surface $12_2$ is not affected by the laser.

The complete removal of the passivation layer at the first surface $12_1$ may be achieved with a single laser pulse.

The fluence of the laser may, in this respect, be between 100 mJ/cm$^2$ and 400 mJ/cm$^2$, and preferably close to 320 mJ/cm$^2$.

The inventors have also found that the surface energy of the sub-layer $14_1$, once discovered, is not affected when performing step a).

This mode of implementation of step a), due to the ease and speed of its implementation, is extremely advantageous.

Figure 3A:
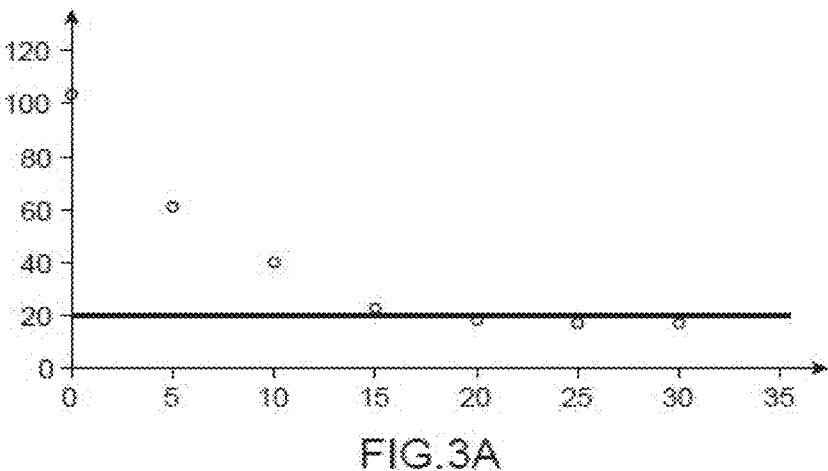
FIGS. 3A and 3B are graphical representations of the evolution of the contact angle (vertical axis, in "°") of a liquid (in particular water) on a surface as a function of an exposure time (horizontal axis, in "seconds"), respectively, to a helium plasma and ultraviolet radiation, the surface exposed to the energy flow comprises in particular a siloxane type material formed by plasma-enhanced vapour deposition, and using octamethylcyclotetrasiloxane (OMCTSO) as a precursor.
Figure 3B:
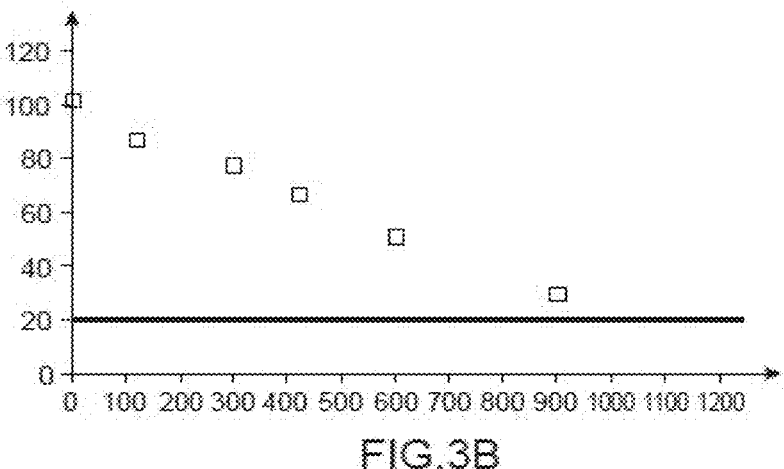
Figure 3C:
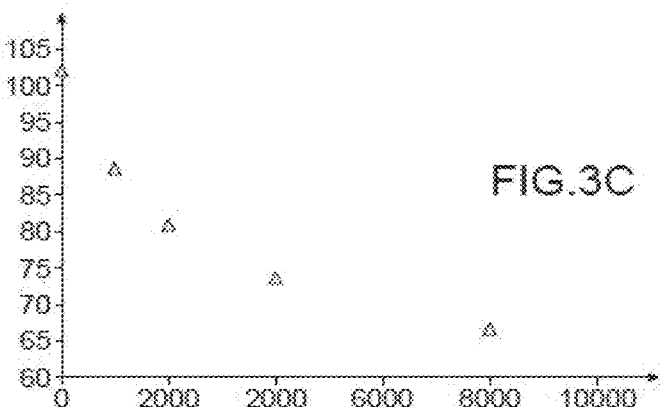
FIG. 3C is a graphical representation of the evolution of the contact angle (vertical axis, in "°") of a liquid, in particular water, on a surface, as a function of a number of pulses emitted by an excimer laser (horizontal axis, "number of pulses"), the surface comprises in particular siloxane formed by plasma-enhanced vapour deposition of OMCTSO.
Figure 3D:
FIG. 3D is an image obtained by optical microscopy of a surface comprising a plurality of cavities having a circular opening of 10 μm diameter, and separated from one another by 15 μm (centre-to-centre distance), the surface comprises in particular a passivation layer made of a SiOC siloxane type material and having a thickness equal to 110 nm, the passivation layer is formed by the plasma-enhanced chemical vapour deposition (PECVD) of OMCTSO.
Figure 3E:
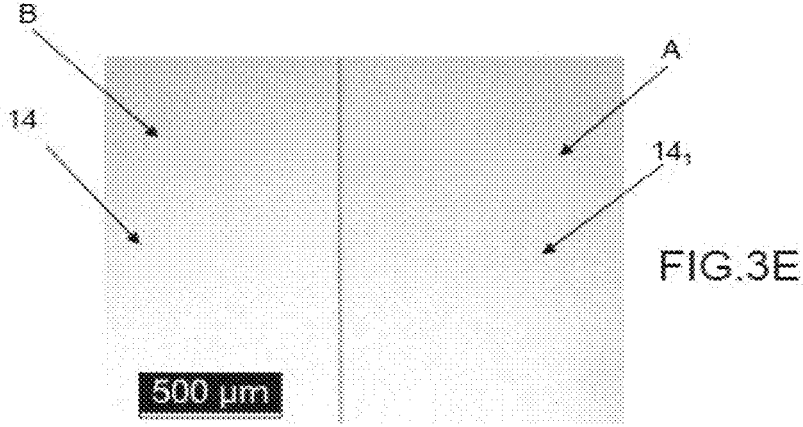
FIG. 3E is an image of a surface after the execution of step a) on an area A of said surface, in particular the surface initially covered with a stack of a passivation layer covering an underlayer, has been exposed to laser radiation intended to spray, in its entirety, the passivation layer in area A.

An example of the implementation of step a) on a stack of layers is shown in FIG. 3E. In particular, the method of selectively spraying the passivation layer $14$ allows only certain areas of the stack to be sprayed. In particular, in FIG. 3E, only area A has been subjected to laser radiation so as to expose the hydrophilic sub-layer $14_1$, whereas area B, which is protected, comprises the stack formed by the hydrophobic sub-layer $14_1$ and passivation layer $14$.

The exposure of the first surface $12_1$ to the energy flow may be executed by means of a mask, and in particular a mask having an opening opposite the first surface. In other words, the mask obstructs the second cavities.

The first surface energy, according to the present invention, is adjusted such that the first surface $12_1$ exerts an attracting effect on the filling liquid $15$.

In other words, the first surface energy is adjusted such that the contact angle of the filling liquid $15$ is low.

A "low wetting angle" is defined as a contact angle of less than 40°, advantageously less than 30°, even more advantageously less than 25°.

The second energy is adjusted such that the second surfaces exert a repelling effect on the filling liquid $15$.

In other words, the second surface energy is adjusted such that the contact angle of the filling liquid $15$ is high.

A "high contact angle" is defined as a contact angle greater than 40°, advantageously greater than 70°, even more advantageously greater than 90°.

In any case, the selectivity of the filling will be obtained by a difference in surface energy between the so-called low and high energy areas of surfaces which will be characterised by a difference in the contact angle of the filling liquid on these two surfaces of at least 30% advantageously greater than 50°.

By way of example, FIGS. 3A and 3B are graphical representations of the evolution of the contact angle (vertical axis) of a liquid, in particular water, on a surface as a function of an exposure time, respectively, to helium plasma and infrared radiation.

The surface exposed to the energy flow comprises in particular a siloxane-type material, for example formed by plasma-enhanced vapour deposition with octamethylcyclotetrasiloxane (OMCTSO) as a precursor.

A decrease in the contact angle of water is clearly observed in each of these graphs. In other words, the surface changes from a hydrophobic state (high contact angle) to a hydrophilic state upon exposure to an energy flow.

FIG. 3C is another example of the evolution of the contact angle (vertical axis, in "°") of a liquid, in particular water, on a surface, as a function of a number of pulses emitted by an excimer laser (horizontal axis, "number of pulses"). The surface comprises in particular siloxane formed by the plasma-enhanced vapour deposition of OMCTSO.

A decrease in the contact angle of water is clearly observed as the number of laser pulses increases. It is thus possible to modulate the hydrophilic nature of the surface.

FIG. 3D is an image obtained by optical microscopy of a surface comprising a plurality of cavities having a circular opening of 10 μm diameter, and separated from one another by 15 μm (distance centre-to-centre). The surface comprises in particular a passivation layer 14 made from a siloxane SiOC type material and a thickness equal to 110 nm. The layer 14 is formed by the plasma-enhanced chemical vapour deposition (PECVD) of OMCTSO.

Thus, within the scope of the present invention, a treatment, which comprises an exposure to an energy flow used selectively on the first surface, makes it possible to give said first surface a surface energy different from that of the second surfaces.

In other words, the spreading of the filling liquid 15, executed during step b), on the front face 21 of the substrate will lead to filling exclusively the first cavity 11.

Figure 8:
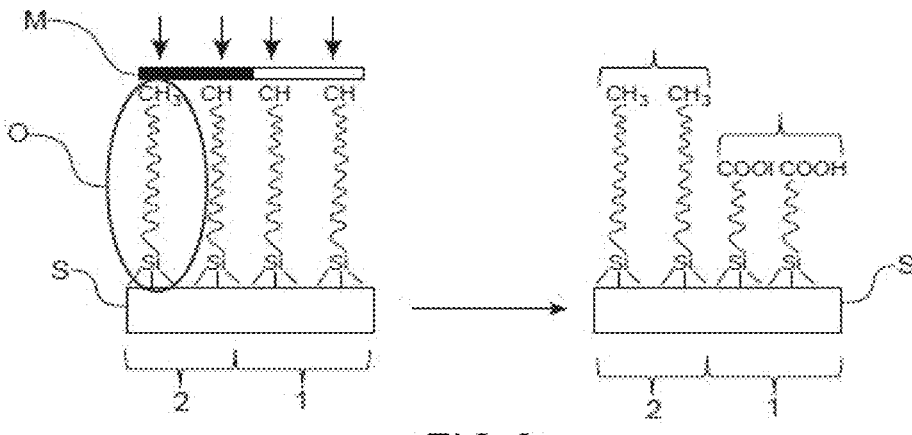
FIG. 8 is a schematic representation of the effect of an energy flow, and in particular of UV radiation, on a silane compound with a hydrophobic carbon chain.

By way of illustration, FIG. 8 is a schematic representation of the mechanism of modifying the surface energy under the effect of ultraviolet radiation (symbolised by the arrows).

In particular, the surface of the substrate S intended to be exposed to UV radiation is previously coated with a layer of material of the siloxane type (O). A mask is positioned opposite the surface so as to expose a region 1 selectively to UV radiation and mask a region 2. The UV radiation has the effect of reducing the size of the carbon chain of the layer of siloxane type material, and to make the latter hydrophilic. The region 2 not exposed to UV radiation preserves its hydrophobic nature.

Step a) according to the present invention may be preceded by step a1) of forming a layer, referred to as the passivation layer 14, by covering the first surface and the second surfaces.

The passivation layer 14 is in particular made of a material, referred to as an active material, configured to modify its surface energy on the effect of the treatment of step a).

The passivation layer 14 may be formed by a plasma-enhanced chemical vapour deposition (PECVD) technique.

The thickness of the passivation layer 14 may be between 1 nm and 1 micrometre, preferably 50 nm to 300 nm.

The active material may comprise at least materials selected from among: a siloxane compound, a fluorosilane, a fluoropolymer, octadecyltriethoxysilane, propyltrimethoxysilane, propyltriethoxysilane, octadecyltrimethoxysilane, octyltrimethoxysilane, octyltriethoxysilane, dodecyltriethoxysilane, dimethoxy-methyl(3,3,3-trifluoropropyl)silane, trichloro(octadecyl)silane, trichloro(3,3,3-trifluoropropyl)silane, 1H,1H,2H,2H-perfluorodecyltrimethoxysilane.

The implementation of step b) of spreading the filling liquid 15 may involve the use of a scraper or a slot die.

The filling liquid 15 may be a mixture which comprises a solvent, a filling matrix and a charge, referred to as an active charge.

In particular, the solvent may comprise a solution of propylene glycol monomethyl ether acetate.

The filling matrix may comprise a transparent acrylate-type material such as for example poly(methyl methacrylate) (PMMA), a silicone or a polymer.

The active charge active may comprise a conversion material, in particular an optical conversion material.

An "optical conversion material" is defined as a material capable of converting radiation of a given wavelength to radiation of a different wavelength.

Such an optical conversion material may comprise in particular phosphors, or also quantum dots.

In a particularly advantageous manner, step b) comprises a plurality, advantageously two, spreading sequences of the filling liquid 15, and the execution of an evaporation sequence of the solvent following each spreading sequence.

Figure 4A:
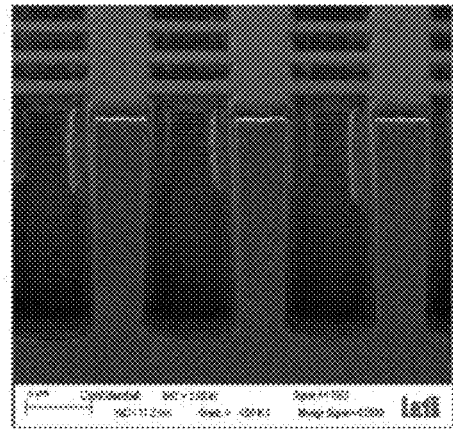
FIGS. 4a and 4b are images obtained by scanning electron microscope of cavities according to a cross-sectional plane of said cavities perpendicular to the bottom and obtained after the execution of steps a) and b) of the filling method according to the present invention, step b) being performed only once.
Figure 4B:
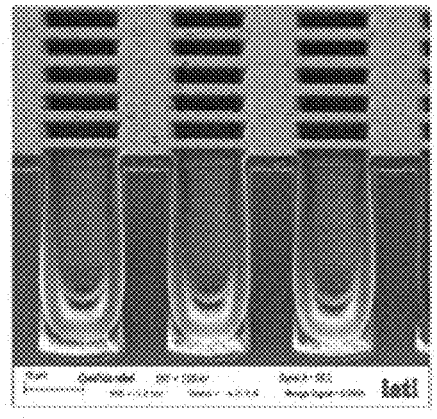

The result of implementing the method according to the present invention on the cavities having an opening with a width of 12 micrometres is shown in FIGS. 4a and 4b.

In particular, the cavities of FIGS. 4a and 4b, the inner surfaces of which are coated with a passivation layer 14, and in particular a layer of siloxane comprising a hydrophobic end, have undergone a differentiated surface treatment.

In particular, the inner surfaces of the cavities of FIG. 4b have been exposed to an ozone plasma, whereas the cavities of FIG. 4a have not undergone any treatment.

Step b) of spreading a liquid filling made from a PGMEA/PMMA (poly(methyl methacrylate)) solution charged with quantum dots was then executed.

At the end of this step b), a partial filling of the cavities of FIG. 4b is clearly observed, while the filling liquid 15 does not seem to penetrate into the cavities of FIG. 4a.

The differentiation in terms of surface energy of the cavities of FIG. 4a and FIG. 4b with respect to the filling liquid 15 make it possible to perform selective filling, and more particularly to fill the cavities with an affinity to the filling liquid 15.

More particularly, the exposure of the passivation layer 14 to a helium plasma makes it possible to modify the contact angle of a drop of the filling liquid 15 on said layer. In other words, the exposure of the passivation layer 14 to a helium plasma modifies the capacity of said layer to be wetted by the filling liquid.

It is however remarkable that, given the level of dilution of the PMMA and quantum dots in the PGMEA solvent, the filling of the cavities in FIG. 4b is only partial.

It is however possible to carry out step b) again, and as many times as possible, in order to completely fill the cavities of FIG. 4b.

Figure 5A:
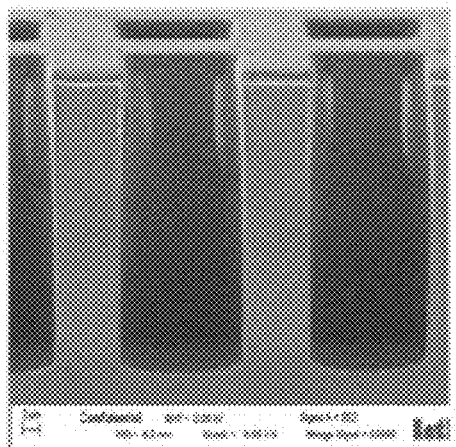
FIGS. 5a and 5b are images obtained by scanning electron microscope of cavities according to a cross-sectional plane of said cavities perpendicular to the bottom, and obtained after the execution of steps a) and b) of the filling method according to the present invention, step b) being performed twice.
Figure 5B:
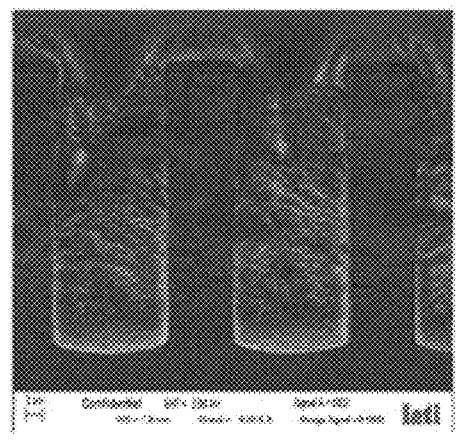

In this respect, FIGS. 5a and 5b show cavities that have undergone a similar protocol to that of the cavities, respectively, of FIGS. 4a and 4b, step b) of spreading the filling liquid 15 having been carried out twice however.

Thus, the cavities of FIG. 5a, which have not been exposed to the plasma treatment, still exert a repelling effect on the filling liquid 15, whereas a complete filling of the cavities of FIG. 5b may be observed.

In an advantageous manner, a solvent evaporation sequence (in this case PGMEA) may be carried out after each spreading sequence.

The evaporation sequence of the filling liquid 15 may comprise a heat treatment step for evaporating the solvent.

In an advantageous manner, the filling matrix may be adapted to solidify after the filling method according to the present invention, and in particular during the heat treatment step, and thus trap the active charge in its volume.

In a particularly advantageous manner, the dilution of the filling liquid 15 in the solvent may be adapted so that the filling of the first cavity 11 is complete or substantially complete after a single spreading step b) has been performed.

Figure 6A:
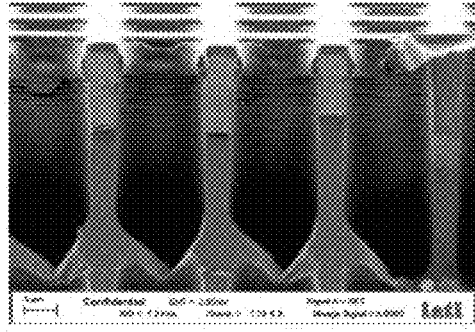
FIGS. 6a and 6b are images obtained by scanning electron microscope of cavities according to a cross-sectional plane of said cavities perpendicular to the bottom, and obtained after the execution of steps a) and b) of the filling method according to the present invention, step b) being carried out only once.
Figure 6B:
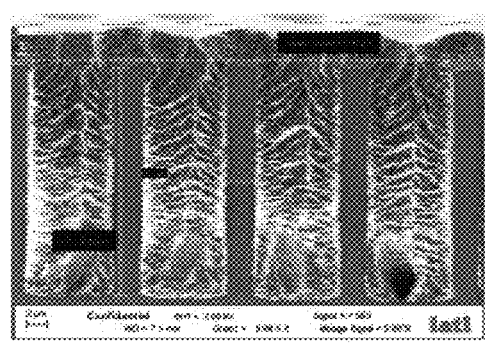

In this respect, FIGS. 6a and 6b illustrate the filling, respectively, of second cavities and first cavities.

In particular, the cavities of FIGS. 6a and 6b, whose inner surfaces are coated with a passivation layer 14, and in particular with a siloxane layer comprising a hydrophobic end, have undergone a differentiated surface treatment.

In particular, the inner surfaces of the first cavities were exposed to UV radiation from a mercury lamp, whereas the second cavities were not treated.

The filling liquid 15 applied in a single step b) comprises a 60% diluted solution of PGMEA/PMMA (poly(methyl methacrylate)) charged with quantum dots, which makes it possible to completely fill the first cavities leaving the second cavities empty.

In other words, a reduction in the dilution of the filling liquid 15 makes it possible to obtain an almost complete or complete filling of the first cavities.

The inventors have also demonstrated that it is possible to fill, in a selective manner, with a filling liquid 15, cavities of very small size, and in particular having an opening of 1 μm.

Figure 7A:
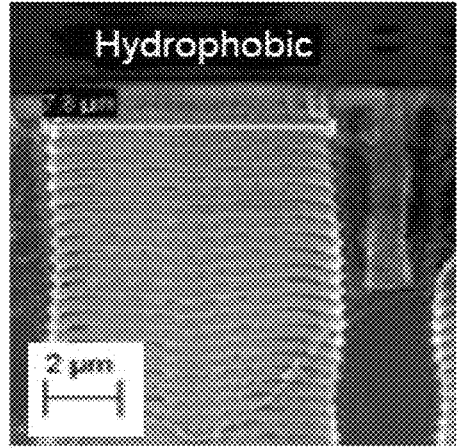
FIGS. 7a and 7b are images obtained by scanning electron microscope of cavities according to a cross-sectional plane of said cavities perpendicular to the bottom, and obtained after the execution of steps a) and b) of the filling method according to the present invention, step b) being carried out only once.
Figure 7B:
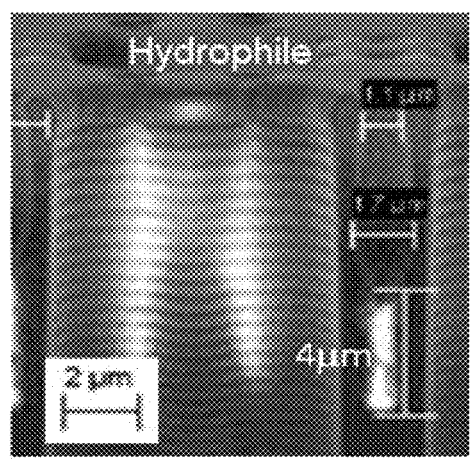

In this respect FIGS. 7a and 7b each show two cavities of 10 micrometres and 1 micrometre respectively, on which the filling method according to the present invention is implemented.

In particular, the cavities of FIGS. 7a and 7b, each coated with a passivation layer 14 have undergone a differentiated surface treatment.

In particular, the inner surfaces of the cavities of FIG. 7b have been exposed to UV radiation from a mercury lamp, whereas the cavities of FIG. 7a have not undergone any treatment.

Step b) of spreading a liquid filling made of a PGMEA/PMMA (poly(methyl methacrylate)) solution charged with quantum dots makes it possible to fill, at least partially the cavities of FIG. 7b, whereas said liquid does not seem to penetrate into the cavities of FIG. 7a.

The images of FIGS. 7a and 7b thus illustrate that the method according to the present invention may selectively fill cavities of very small size, and in particular of a size between 1 micrometre and 10 micrometres.

The method according to the present invention may be carried out to successively fill a plurality of cavities, in particular all the cavities, of a group of cavities 10, with a different filling liquid 15.

FIGS. 9a to 9d illustrate the implementation of the filling method for filling, successively, 3 cavities 11a, 11b and 11c among a group of 4 cavities 11a, 11b, 11c and 11d formed on a support 20.

Figure 9A:
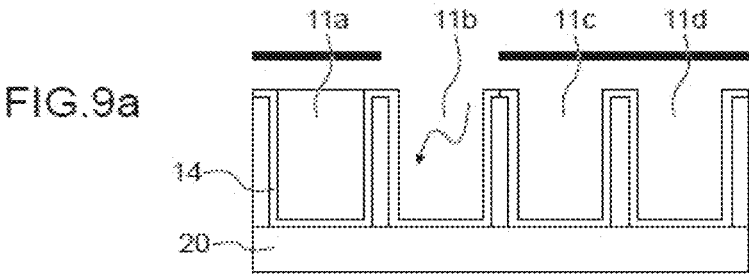
FIGS. 9a to 9d are schematic representations of a manufacturing method involving the successive filling of a plurality of cavities among a group of cavities.

FIG. 9a illustrates the selective filling, by a first filling liquid, of cavity 11a among cavities 11a, 11b, 11c and 11d.

Figure 9B:
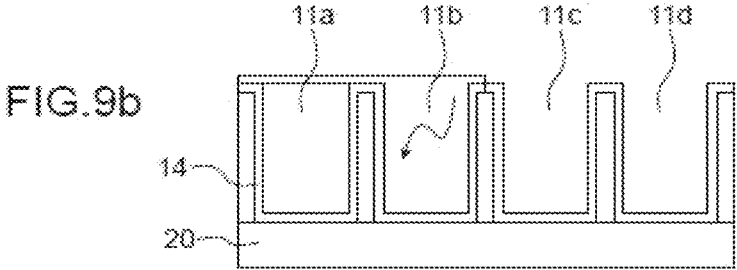

FIG. 9b illustrates the selective filling, by a second filling liquid different from the first filling liquid 15, of cavity 11b among cavities 11b, 11c and 11d.

Figure 9C:
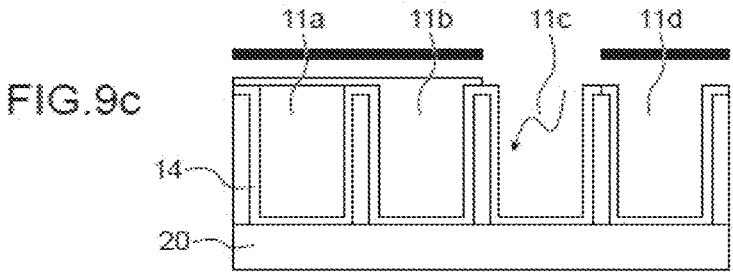
Figure 9D:
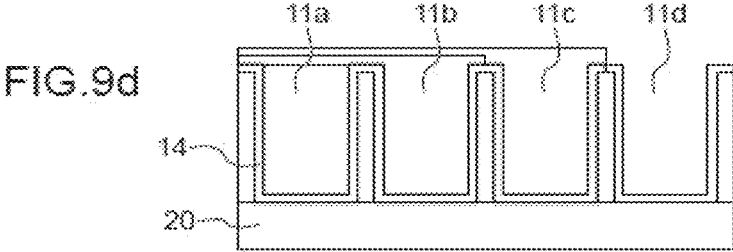

FIG. 9c illustrates the selective filling, by a third filling liquid different from the second filling liquid 15, of cavity 11c among cavities 11c and 11d.

Cavity 11d may be left empty or also filled with a filling liquid.

The successive filling of cavities of a group of cavities 10 may advantageously be implemented for the manufacture of a colour display device.

In this case, a group of cavities 10 as described above forms a colour pixel, each of the cavities being provided with at least one light-emitting diode arranged on their bottom. The light-emitting diode may in particular comprise one or more nanowires, microwires or pyramids.

More particularly, the invention may use a plurality of pixels, in particular identical pixels, arranged on the front face 21 of the support substrate 20.

The pixels may advantageously be arranged in matrix form.

A "matrix form" is defined as a mesh with N rows and M columns.

Each pixel comprises a cavity 11a for emitting blue radiation, a cavity 11b for emitting red radiation and a cavity 11c for emitting green radiation.

The cavity 11d may also be filled according to the filling method. For example, the cavity 11d may be intended for emitting yellow or white, or even blue or green or red radiation.

The filling method may be used to initially (FIG. 9a), and selectively, fill all of the cavities 11a with a filling liquid 15, referred to as the first liquid. The first liquid may comprise an active charge (optically active) for emitting radiation of a given wavelength, referred to as the first wavelength.

The filling method may then (FIG. 9b) be used to fill, in a selective manner, all of the cavities 11b with a filling liquid 15, referred to as the second liquid. The second liquid may comprise an active charge (optically active) for emitting radiation of a given wavelength, referred to as the second wavelength different from the first wavelength.

Lastly, the filling method may be used a third time (FIG. 9c) to fill, in a selective manner, all of the cavities 11c with a filling liquid 15, referred to as the third liquid. The third liquid may comprise an active charge (optically active) for emitting radiation of a given wavelength, referred to as the third wavelength different from the first wavelength and the second wavelength. The presence of an active charge is not strictly required, in particular when the cavity comprises one or more light-emitting diodes made of GaN and intended to emit blue radiation.

The first wavelength, the second wavelength, and the third wavelength may correspond for example respectively to blue radiation, red radiation and green radiation.

The method according to the present invention then makes it possible to fill the cavities selectively without affecting the production rates.

In particular, the first cavities of a plurality of groups of cavities may be filled collectively and selectively with the second cavities of said groups of cavities.

The shape and size of the cavities are not a limitation to the implementation of the method according to the present invention. In particular, the cavities may have identical characteristics without changing the selectivity of the method according to the present invention.

Finally, the method according to the present invention also makes it possible to fill cavities of small size, and in particular in the order of 1 micrometre.

REFERENCES

[1] FR 3053530
[2] FR 3046021

13

[3] FR 3012676;
[4] Zhu et al., "*Experiments and analysis on self-motion behaviors of liquid droplets on gradient surfaces*", Experimental Thermal and Fluid Science, 33, 947-954, (2009).

The invention claimed is:

1. A method for selectively filling, with a filling liquid, a first cavity of at least one group of cavities each opening out onto a front face of a substrate, each of the cavities comprising an inner surface, the method comprising the following steps:

a) a treatment step for modifying a surface energy of the inner surface of the first cavity, referred to as a first surface, and surface energies of the inner surfaces, referred to as second surfaces, of second cavities other than the first cavity, such that the first surface has a first surface energy and the second surfaces have a second surface energy different from the first energy; and b) a step which comprises at least one sequence of spreading the filling liquid on the front face, the first surface energies and the second surface energies being adjusted such that the first and the second surfaces exert an attracting and repelling effect respectively on the filling liquid, step b) thus resulting in the selective filling, by the filling liquid, of the first cavity with respect to the second cavities, wherein step a) comprises a plasma treatment or a treatment with ultraviolet radiation performed selectively on the first surface or on the second surfaces, and wherein step b) comprises:

spreading a first liquid to fill the first cavity, and spreading a second liquid over the first and second cavities, filling at least one of the second cavities and forming a layer of the second liquid remaining to cover the filled first cavity.

2. The method for selectively filling according to claim 1, wherein step a) is executed selectively on the first surface or on the second surfaces by masking, respectively, the second surfaces or the first surface.

3. The method for selectively filling according to claim 1, wherein step a) is preceded by a step a1) of forming a passivation layer by covering the first surface and the second surfaces, the passivation layer being made from an active material configured to modify its surface energy on an effect of the treatment of step a).

4. The method for selectively filling according to claim 3, wherein the passivation layer comprises at least one of the materials selected from among: a siloxane compound, a fluorosilane, a fluoropolymer, octadecyltriethoxysilane, propyltrimethoxysilane, propyltriethoxysilane, octadecyltrimethoxysilane, octyltrimethoxysilane, octyltriethoxysilane, dodecyltriethoxysilane, dimethoxy-methyl (3,3,3-trifluoropropyl)silane, trichloro(octadecyl)silane, trichloro(3,3,3-trifluoropropyl)silane, 1H, 1H,2H,2H-perfluorodecyltrimethoxysilane.

5. The method for selectively filling according to claim 3, wherein the passivation layer is formed according to one of a chemical vapour phase deposition method and a chemical vapour phase deposition method activated by plasma.

6. The method for selectively filling according to claim 1, wherein the filling liquid is a mixture which comprises a solvent, a filling matrix and an active charge.

7. The method for selectively filling according to claim 6, wherein step b) comprises a plurality of sequences of spreading filling liquid, and executing a sequence of evaporation of the solvent following each spreading sequence.

8. The method for selectively filling according to claim 7, wherein the sequence of evaporation of the solvent comprises a heat treatment step for evaporating the solvent.

9. The method for selectively filling according to claim 6, wherein the solvent comprises a solution of propylene glycol monomethyl ether acetate.

10. The method for selectively filling according to claim 6, wherein the filling matrix comprises an acrylate type transparent material.

11. The method for selectively filling according to claim 6, wherein the active charge comprises a conversion material being one of quantum dots or phosphors.

12. The method for selectively filling according to claim 1, wherein a bottom of each of the cavities is functionalised.

13. The method for selectively filling according to claim 12, wherein the functionalisation of the bottom of each of the cavities comprises using a light-emitting diode having a form of one of at least one nanowire, at least one microwire, and at least one pyramid.

14. A method of manufacture including filling cavities of a group of cavities with a different filling liquid, the method of manufacture comprising successive filling of cavities among the group of cavities according to the filling method according to claim 1.

15. The method according to claim 14, wherein the group of cavities forms a pixel of a display device.

16. The method according to claim 15, wherein each of the cavities forming the pixel emits a different colour.

17. The method for selectively filling according to claim 1, wherein each of the first and second cavities has a bottom and lateral walls delimiting a cavity volume, and the cavity volumes are separate and non-overlapping.

18. The method for selectively filling according to claim 17, wherein step a) is executed selectively on the first surface or on the second surfaces by masking, respectively, the second surfaces or the first surface.

19. The method for selectively filling according to claim 1, wherein each of the first and second cavities has a bottom and lateral walls delimiting a cavity volume, the cavity volumes are separate and non-overlapping, and step a) is preceded by a step a1) of forming a passivation layer by covering the first surface and the second surfaces, the passivation layer being made from an active material configured to modify its surface energy on an effect of the treatment of step a).

20. The method for selectively filling according to claim 19, wherein the passivation layer comprises at least one of the materials selected from among: a siloxane compound, a fluorosilane, a fluoropolymer, octadecyltriethoxysilane, propyltrimethoxysilane, propyltriethoxysilane, octadecyltrimethoxysilane, octyltrimethoxysilane, octyltriethoxysilane, dodecyltriethoxysilane, dimethoxy-methyl(3,3,3-trifluoropropyl)silane, trichloro(octadecyl)silane, trichloro(3,3,3-trifluoropropyl)silane, 1H, 1H,2H,2H-perfluorodecyltrimethoxysilane.

21. The method for selectively filling according to claim 19, wherein the passivation layer is formed according to one of a chemical vapour phase deposition method and a chemical vapour phase deposition method activated by plasma.

22. The method for selectively filling according to claim 17, wherein the filling liquid is a mixture which comprises a solvent, a filling matrix and an active charge.

23. The method for selectively filling according to claim 22, wherein step b) comprises a plurality of sequences of spreading filling liquid, and executing a sequence of evaporation of the solvent following each spreading sequence.

24. The method for selectively filling according to claim 23, wherein the sequence of evaporation of the solvent comprises a heat treatment step for evaporating the solvent.

25. The method for selectively filling according to claim 22, wherein the solvent comprises a solution of propylene glycol monomethyl ether acetate.

26. The method for selectively filling according to claim 22, wherein the filling matrix comprises an acrylate type transparent material.

27. The method for selectively filling according to claim 22, wherein the active charge comprises a conversion material being one of quantum dots or phosphors.

28. The method for selectively filling according to claim 17, wherein the bottom of each of the cavities is functionalised.

29. The method for selectively filling according to claim 28, wherein the functionalisation of the bottom of each of the cavities comprises using a light-emitting diode having a form of one of at least one nanowire, at least one microwire, and at least one pyramid.

30. A method of manufacture including filling cavities of a group of cavities with a different filling liquid, the method of manufacture comprising successive filling of cavities among the group of cavities according to the filling method according to claim 17.

31. The method according to claim 30, wherein the group of cavities forms a pixel of a display device.

32. The method according to claim 31, wherein each of the cavities forming the pixel emits a different colour.

33. The method for selectively filling according to claim 1, wherein the first and second liquids are different from each other.

* * * * *